United States Patent [19]

Bissonette

[11] 3,970,458

[45] July 20, 1976

[54] IMAGEWISE HARDENING WITH INERT TRANSITION METAL COMPLEX OXIDIZING AGENTS

[75] Inventor: Vernon Leon Bissonette, Brockport, N.Y.

[73] Assignee: Eastman Kodak Company, Rochester, N.Y.

[22] Filed: Nov. 28, 1973

[21] Appl. No.: 420,192

Related U.S. Application Data

[63] Continuation-in-part of Ser. No. 189,289, Oct. 14, 1971, abandoned, and a continuation-in-part of Ser. No. 312,157, Dec. 4, 1972, Pat. No. 3,856,524.

[52] U.S. Cl. .................................... 96/55; 96/33; 96/35; 96/48 R; 96/49; 96/50 R; 96/60 R; 96/66 R; 96/111
[51] Int. Cl.$^2$ ................... G03C 7/00; G03C 5/26; G03C 5/24; G03C 5/30
[58] Field of Search ............ 96/54, 60 R, 66 R, 111, 96/35, 48 R, 50, 49, 48 PD, 33, 55, 48 R; 117/62.2; 427/337, 338

[56] References Cited
UNITED STATES PATENTS 3,615,508   10/1971   Stephen .......................... 96/60 BF
3,748,138   7/1973    Bissonette ........................ 96/66.3
3,856,524   12/1974   Bissonette ........................ 96/111
3,862,842   1/1975    Bissonette ....................... 96/66 R Primary Examiner—David Klein
Assistant Examiner—Richard L. Schilling
Attorney, Agent, or Firm—G. E. Battist

[57] ABSTRACT

An improvement is provided in processes wherein an oxidation-reduction reaction is utilized to form an image. In one aspect of this invention, the improvement comprises employing an oxidizing agent and a reducing agent which undergo imagewise redox reaction in the presence of catalytic material, the oxidizing agent and the reducing agent being so chosen that the reaction products are noncatalytic for the oxidation-reduction reaction. In another aspect of this invention, a substitution inert metal complex is utilized as the oxidant in oxidation-reduction image-forming processes. Novel processing compositions and photographic materials are also described. In a specific aspect, this divisional application relates to processes for tanning a crosslinkable colloid with the reaction products of the above redox reaction.

28 Claims, No Drawings

IMAGEWISE HARDENING WITH INERT TRANSITION METAL COMPLEX OXIDIZING AGENTS

This application is a continuation-in-part of U.S. Ser. No. 189,289 filed Oct. 14, 1971, now abandoned, and a continuation-in-part of U.S. Ser. No. 312,157 filed Dec. 4, 1972, issued as U.S. Pat. No. 3,856,524 on Dec. 24, 1974.

This invention relates to image formation. In one aspect, it relates to image-formation processes which utilize a redox reaction. In certain other aspects, it relates to image amplification or image replacement.

A variety of image-forming systems have been described in the prior art which utilize redox reactions. Belgian Patent 742,768 of June 8, 1970, describes an image amplification procedure which features the use of peroxy compounds and reducing agents, such as photographic color-developing agents However, such redox systems are highly unstable; photographic color-developing agents are oxidized merely in the presence of air and peroxy compounds react extremely rapidly with such reducing agents. Hence, it would be desirable to provide image-forming redox systems in which the oxidizing and reducing agents are more stable.

U.S. Pat. No. 3,152,903 by Sheppard et al issued October 17, 1964, suggests various redox systems which have a physical barrier, (e.g., phase separation) to prevent redox reaction. The oxidizing and reducing agents proposed undergo substantially immediate redox reaction in the absence of external catalyst when they are incorporated in an inert solvent solution. There appears to be no disclosure in this patent of a redox system which is stable in the absence of some physical barrier.

British Patent 777,635 published June 26, 1957, suggests photographic bleach baths which contain a cobalt (III) complex and which may contain a reducing agent, However, photographic bleach baths contain a silver halide solvent. In the presence of silver halide solvent, the cobalt complex reacts directly with the silver and does not undergo, to any significant degree, redox reaction with the reducing agent.

Photographic physical-developer solutions are well known in the art. For example, Dippel et al in U.S. Pat. No. 2,750,292 issued June 12, 1956, describe the formation of dyes simultaneously and in situ with the formation of a metal image during physical development of a photographic element containing a metal image and a photographic coupler, with a solution containing photographic color-developing agent and a reducible metal salt. However, a serious disadvantage with physical developers is that they do not have a high degree of stability. One reason for this instability is that the reaction products of the redox reaction are catalysts for further redox reaction, i.e., the reaction is autocatalytic. It would, accordingly, be desirable to provide a nonautocatalytic oxidizing-reducing agent combination.

Christensen, U.S. Pat. No. 2,517,541 issued Aug. 8, 1950, describes photographic silver halide emulsions containing amounts less than about 0.1% by weight of the wet emulsion of an alkali metal cobalticyanide. The exposed elements containing this addendum are developed in typical photographic developer solutions. The low concentrations of cobalticyanide proposed probably are necessary to avoid fogging the emulsion. Such low amounts of potassium cobalticyanide would not contribute substantially to image formation via redox reaction, even if there is a redox reaction between the cobalticyanide and the developer in areas where silver is developed. However, it is unlikely that even limited redox reaction occurs because potassium cobalticyanide does not undergo redox reaction with typical color-developing agents in the presence of predeveloped silver.

It is well-known that polymerization of photopolymers can be initiated by a radical which an be liberated through a light-catalyzed redox reaction. See Rust, "Fast Imaging Systems Using Photopolymers", *Optical Spectra*, March/April, 1968, pp. 41–45 at p. 42. There does not, however, appear to by any suggestion in the art relative to providing a stable reducing agent-oxidizing agent combination which can be catalyzed into a redox reaction with a catalytic material.

British Patent 1,194,581 published June 10, 1970, describes an imaging process in which a photosensitive composition, upon exposure to light, generates nuclei of a metal which is more noble than silver and is catalytic to the electroless deposition of a nonnoble metal. An image is formed by an electroless deposition of nonnoble free metal on the nuclei. There appears to be no disclosure in this patent of a stable redox system which is nonautocatalytic.

In the photographic dye bleach system, such as described by Gasper, U.S. Pat. No. 2,270,118 issued Jan. 13, 1942, dyes are produced imagewise by treating diffusely dyed layers containing silver images with an acid solution which destroys the dye imagewise in areas where silver is present. The destruction of the dye can be accelerated with various "catalysts", such as phenazine. The reactions in the dye bleach system appear to proceed on a stoichiometric basis. See Mayer et al, U.S. Pat. No. 3,340,060 issued Sept. 5, 1967, col. 1, lines 18–21, noting that 4 silver atoms are required to destroy 1 azo dye group. It would be desirable to provide a photographic system which would make more efficient use of silver than in the silver dye bleach process.

British Patent 239,875 published Nov. 5, 1925, describes a photographic element useful in the diazo process which includes a cobalt (III) metal complex and, optionally, silver halide. This diazo image-forming process is a substitution reaction rather than a redox reaction. Further, the incorporated cobalt(III) complex fogs the silver halide.

There is a need in the art, therefore, for image-forming systems which feature a reducing-oxidizing agent combination which is relatively inert to redox reaction even when in a reactive environment and which do not form reaction products which catalyze the redox reaction. Further, there is need in the art for redox reaction systems which can be utilized to amplify faint images or replace images with other images having a different color value. In addition, it is desirable to provide a method whereby the extremely high light sensitivity of photographic silver halide can be utilized to generate a latent or faint silver image that acts as a catalyst for a redox system to amplify or replace the silver image.

One object of this invention is to provide a method and composition for forming images.

Another object of this invention is to provide an image-forming method in which a redox reaction is utilized to produce a change in light value.

Still another object of this invention is to provide an image-forming process in which at least one of the reaction products of a redox reaction is utilized to tan a binder such as a hydrophilic colloid.

A further object of this invention is to provide a method for amplifying faint or invisible images.

Another object of this invention is to supplement metal images with dye images and/or hardened hydrophilic colloid images.

Still another object of this invention is to replace metallic images with dye images and/or hydrophilic colloid images.

Another object of this invention is to provide a method for increasing the amount of tanning or crosslinking which can be obtained in photographic elements with a given amount of photosensitive recording material.

Other objects of this invention will be apparent from the disclosure herein and the appended claims.

In one embodiment of this invention, an improvement is provided in an image-forming process wherein an oxidation-reduction reaction is utilized to from a photographic image, which improvement comprises employing an oxidizing agent and a reducing agent which undergo redox reaction in the presence of catalytic material and which are essentially inert to oxidation-reduction reaction in the absence of a catalytic material, the oxidizing agent and the reducing agent being so chosen that the reaction products thereof are noncatalytic for the oxidation-reduction reaction. At least one of the reaction products is then used to harden, tan or crosslink a hardenable material.

In another embodiment of this invention, an improvement is provided in an image-forming process wherein a reaction product of an oxidation-reduction reaction is utilized to form a photographic image, such as a hardened hydrophilic colloid, which improvement comprises employing an oxidizing agent and a reducing agent which undergo imagewise redox reaction at a catalytic surface, the oxidizing agent being complex of a metal ion with ligands which, when a test sample of the complex is dissolved at 0.1 molar concentration at 20° C. in an inert solvent solution containing a 0.1 molar concentration of an uncoordinated ligand, exhibit essentially no exchange of uncoordinated and coordinated ligands for at least 1 min.

In a further embodiment of this invention, an improvement is provided in a method of forming photographic images wherein a dye is produced in addition to hardening a binder vehicle. An aromatic primary amino color-developing agent can be oxidized in the development of an exposed photographic silver halide emulsion, and the oxidized color-developing agent reacts with a photographic color coupler to form a dye.

In still another embodiment of this invention, processing compositions are provided comprising the oxidation-reduction combination featured in this invention.

The terms "tan", "harden" and "crosslink" are used interchangeably herein and generally refer to reactions wherein a binder vehicle or colloid is reacted to increase substantially the melting point, lower the water solubility, etc.

Oxidants preferred in the practice of this invention are the metal complexes, such as a transition metal complex, e.g., a Group VIII metal complex, or a complex of a metal of Series 4 of the periodic table appearing on pp. 54–55 of Lange's *Handbook of Chemistry*, 8th Edition, published by Handbook Publisher, Inc., Sandusky, Ohio, 1952. Such complexes feature a molecule having a metallic atom or ion. This metallic ion is surrounded by a group of atoms, ions or other molecules which are generically referred to as ligands. The metallic atom or ion in the center of these complexes is a Lewis acid; the ligands are Lewis bases. Werner complexes are well-known examples of such complexes. The useful metal salts are typically capable of existing in at least two valent states. In a preferred aspect of the invention, the metal complexes are those referred to by American chemists as "inert" and by European chemists as "robust". Particularly useful are complexes of a metal ion with a ligand which, when a test sample thereof is dissolved at 0.1 molar concentration at 20° C. in an inert solvent solution also containing 0.1 molar concentration of a tagged ligand of the same species which is uncoordinated, exhibits essentially no exchange of uncoordinated and coordinated ligands for at least 1 min., and preferably for at least several hours, such as up to 5 hr. or more. This test is advantageously conducted under the pH conditions which will be utilized in the practice of the invention. In silver halide photography, this generally will be a pH of over about 8. Many metal complexes useful in this invention show essentially no exchange of uncoordinated and coordinated ligands for several days. The definition of inert metal complexes and the method of measuring ligand exchange using radioactive isotopes to tag ligands are well-known in the art; see, for example, Taube, *Chem. Rev.*, Vol. 50, p. 69 (1952), and Basolo and Pearson, *Mechanisms of Inorganic Reactions, A Study of Metal Complexes and Solutions*, 2nd Edition, 1967, published by John Wiley and Sons, p. 141. Further details on measurement of ligand exchange appear in articles by Adamson et al, *J. Am. Chem. Soc.*, Vol. 73, p. 4789 (1951). The inert metal complexes should be contrasted with labile complexes which, when tested by the method described above, have a reaction half-life generally less than 1 min. Metal chelates are a special type of metal complex in which the same ligand (or molecule) is attached to the central metal ion at two or more different points. The metal chelates generally exhibit somewhat slower ligand exchange than nonchelated complexes. Labile-type chelates may have a half-life of several seconds, or perhaps slightly longer. Generally, the oxidizing agents employed are not reduced to a zero valent metal during the redox reaction of the invention.

Preferred metal complexes in accordance with this invention have coordination numbers of 6 and are known as octahedral complexes. Cobalt complexes are especially useful in the practice of this invention. Most square planar complexes (which have a coordination number of 4) are rather labile, although some Group VIII metal square planar complexes, particularly platinum and palladium square planar complexes, exhibit inertness to rapid ligand exchange.

A wide variety of ligands can be used with a metal ion to form suitable metal complexes. Nearly all Lewis bases (i.e., substances having an unshared pair of electrons) can be ligands in metal complexes. Some typical useful ligands include the halides, e.g., chloride, bromide, fluoride, nitrite, water, amino, etc., as well as such common ligands as those referred to on p. 44 of Basolo et al, supra. The lability of a complex is influenced by the nature of the ligands selected in forming said complex.

Particularly useful cobalt complexes have a coordination number of 6 and have a ligand selected from the group consisting of ethylenediamine(en), diethylenetriamine(dien), triethylenetetraamine(trien), amine ($NH_3$), nitrate, nitrite, azide, water, carbonate and propylenediamine(tn). Especially useful are the cobalt complexes containing ammine ligands such as the cobalt hexammine salts. Some specific highly useful cobalt complexes include those having one of the following formulas: $[Co(NH_3)_5H_2O]X$, $[Co(NH_3)_5CO_3]X$, $[Co(NH_3)_5Cl]X$, and $[Co(NH_3)_4CO_3]X$, wherein X represents one or more anions determined by the charge neutralization rule, and X preferably represents polyatomic organic anions.

Complexes containing oxidized noble metals or ferramagnetic metals, such as complexes of CoIII, FeIII, RhIII, PtIV, PdIV and IrIII, which have reactivities similar to the complexes listed above, could be used in the practice of this invention. The redox equilibria published in *Stability Constants of Metal-Ion Complexes*, Sillen and Martell, published by The Chemical Society, Burlington House, London, England (1964), indicate that other complexes have reactivities generally similar to the cobalt complexes mentioned above.

In one preferred embodiment according to this invention where the cobalt(III) ion complexes are incorporated in the photographic element, the anions of the complexes are polyatomic anions, and in some highly preferred embodiments are polyatomic organic anions. The anions are associated with the cobalt(III) ion complex in what may be a salt, an outer sphere complex of an ion pair; see, for example, p. 34 of Basolo et al, supra. Typical useful polyatomic anions include sulfato groups, nitrate, and the like. Typical polyatomic organic anions include acetato, propionato, methanesulfonato, benzenesulfonato, hexanesulfonate, and the like.

The polyatomic anions are preferably those which in the sodium salt form are not silver halide solvents, i.e., the sodium salt of the polyatomic anion when employed in an aqueous solution (60° C.) at a 0.02 molar concentration does not dissolve more than 5 times the amount by weight of silver chloride which can be dissolved in distilled water at 60° C. The sodium salts of anions such as thiocyanate and thiosulfate in a 0.02 molar concentration dissolve more than 5 times the amount by weight of silver chloride which is dissolved by distilled water at 60° C.

In another embodiment where cobalt(III) ion complexes are incorporated in the photographic element, they are incorporated as water-insoluble ion pairs. The use of water-insoluble ion pairs of cobalt(III) ion complexes is described in more detail in Bissonette et al, U.S. Ser. No. 307,894 entitled "Ion-Paired Cobaltic Complexes and Photographic Elements Containing Same", filed Nov. 20, 1972, issued as U.S. Pat. No. 3,847,619 on Nov. 12, 1974, which is incorporated herein by reference. Generally, these ion pairs comprise a cobalt(III) ion complex ion-paired with an anionic organic acid having an equivalent weight of at least 70 based on acid groups. Preferably, the acid groups are sulfonic acid groups.

In certain highly preferred embodiments, cobalt(III) ion complexes are used in this invention which contain ammine ($NH_3$) ligands or have a net positive charge which is preferably a net charge of +3. A cobalt(III) ion with six ($NH_3$) ligands has a net charge of +3. A cobalt(III) ion with five ($NH_3$) ligands and one chloro ligand has a net charge of +2. A cobalt (III) ion with two ethylenediamine(en) ligands and two ($N_3$) azide ligands has a net charge of +1. Generally, the best tanning results have occurred where the cobalt(III) complex has a net charge of +3 and/or the cobalt complex contains at least three ammine ligands.

When the cobalt(III) ion complexes are used in a liquid solution to obtain tanning, the liquid composition can contain from about 10 mg. to about 50 g./l. of solution, and preferably it contains from about 100 mg. to about 10 g./l. based on cobalt. Where the cobalt(III) ion complex is incorporated in the photographic element, good tanning can be achieved when the element contains the cobalt(III) ion complex in a concentration at least 0.5% by weight of unhardened hydrophilic colloid in said element based on cobalt and preferably at least 1.0%.

The redox reaction which takes place in the practice of this invention occurs at a catalytic surface, i.e., the reaction environment is a heterogeneous medium wherein the catalyst is in one phase, the oxidant and reductant are in another phase, and the reaction takes place on the interface between the phases. Generally, the catalyst will be a solid material and the oxidant and the reductant will be in a liquid phase. Any catalytic material can be utilized which initiates and promotes redox reaction between the oxidizing agents and reducing agents selected. While the reaction mechanism is not completely understood, it appears that the catalyst appears to allow electron transfer between the oxidizing agent and the reducing agent. In a preferred embodiment, the catalysts are the metals or chalcogens of Group VIII or 1B elements. In another embodiment, the catalyst can be an activated carbon or activated charcoal. Many useful catalysts are the zero valent metals or metal nuclei. Specific useful catalysts include metals such as platinum, copper, silver, gold and chalcogens such as silver sulfides, silver oxides, nickel sulfide, cuprous sulfide, cobalt sulfide, aurous sulfide and cupric oxide. While several of the catalysts are referred to as chalcogens, it is understood that, in some instances, an equilibrium mixture may be present in the product, such as a mixture of silver hydroxide and silver oxide.

In accordance with this invention, the catalyst appears to provide redox reaction in a true catalytic fashion. The amount of redox reaction is not limited by the amount of catalyst present, since the redox reaction of this invention does not proceed on a stoichiometric basis with respect to the catalyst. Generally, in the absence of the catalyst the oxidant and the reductant can be described as being in a state where they are substantially kinetically stable; i.e., the kinetic reaction is so slow or practically nonexistent as to be not noticeable in the process. The catalyst appears to interact with the oxidant and/or reductant in such a fashion as to overcome the kinetic barrier. Where the oxidant and reductant are thermodynamically stable in the reaction medium, the catalyst can lower the kinetic barrier by converting either the oxidant or reductant to another form which will provide a thermodynamically unstable combination which is also kinetically unstable. Where the oxidant and reductant are thermodynamically unstable but substantially kinetically stable, the catalyst can function to lower the kinetic barrier, allowing the reaction to proceed at a substantially faster rate.

Some care is needed in selecting the particular oxidant-reductant-catalyst combination employed in the practice of the invention, bearing in mind the circumstances governing any particular embodiment of the invention. The oxidizing-reducing agent combination should undergo essentially no redox reaction except in the presence of external catalyst material. Also, the catalyst should be so selected that it is essentially unreactive under the conditions employed with either the oxidizing agent alone or reducing agent alone. In the environment in which the reaction takes place, the catalyst should promote the redox reaction, but should not itself undergo a redox reaction directly with either the reducing agent or oxidizing agent to any substantial degree. Preferably, the oxidizing agent and the reducing agent are so chosen that, when test samples thereof are each dissolved at a 0.01 molar concentration in an inert solvent at 20° C., essentially no redox reaction occurs for at least 15 minutes and preferably for several hours, such as 12 hours, or several days, such as a month or more.

Combinations of oxidant and reductant which undergo a more rapid redox reaction in the absence of catalyst are, however, useful in embodiments of the invention where the oxidizing agent and reducing agent are in reactive condition for brief periods of time. In one such embodiment, separate solutions of oxidizing agent and reducing agent can be sprayed on a support carrying an imagewise distribution of catalyst. An imagewise redox reaction takes place in the presence of the catalyst. After sufficient redox reaction occurs, the unreacted reducing agent and oxidizing agent are removed in any convenient manner, for example, using an air jet, a stream of liquid or a chemical neutralizer. In other embodiments of the invention, an imagewise pattern of catalyst, together with a nonimagewise distribution of oxidant (or reductant), can be contacted with reductant (or oxidant) for a time sufficient to permit imagewise redox reaction. Thereafter, the reductant (or oxidant) can be removed. In these and other embodiments of the invention, the oxidant and reductant need not possess a high degree of inertness to redox reaction in the absence of catalyst.

In preferred embodiments of the invention, an imagewise pattern of catalyst is contracted with the combination of oxidizing and reducing agent in accordance with the invention. However, a nonimagewise distribution of oxidizing agent and catalyst can be contacted with an imagewise pattern of reducing agent, or an imagewise pattern of oxidizing agent can be contacted with the combination of reducing agent and catalyst to form images in accordance with the invention. Also, an imagewise pattern of catalyst, together with a nonimagewise distribution of oxidizing agent, can be contacted with reducing agent or an imagewise pattern of catalyst, together with a nonimagewise distribution of reducing agent, can be contacted with oxidizing agent to initiate redox reaction in accordance with the invention.

Any suitable means can be utilized to contact the oxidizing agent, reducing agent and catalyst. For example, an imagewise pattern of catalyst can be contacted with a solution containing oxidant and reductant. In one convenient embodiment of the invention, a hydrophilic colloid layer coated on a suitable support contains a pattern of catalyst and is contacted with an aqueous solution containing oxidant and reductant. The concentration of reductant and oxidant in such solutions can vary over a wide range. Optimum concentrations depend on such variables as time of contact, amount of catalyst present and reactivity of the particular oxidizing agent-reducing agent-catalyst combination chosen. Typical useful concentrations of oxidant and reductant, each, range from about 0.1 to 50, and preferably 1 to 15, g./liter of solution, using contact or residence times of about 30 sec. up to 2 hr. or longer. The oxidizing agent and reducing agent can also be contained in and released from rupturable pods or pressure-sensitive capsules. An alternative method for initiating redox reaction in accordance with the invention involves incorporating the oxidant and reductant in a hydrophilic colloid layer, coated on a suitable support, and contacting the layer with a plate bearing a metal catalyst relief image. The metal relief image initiates and promotes the redox reaction between the oxidant and reductant contained in the hydrophilic colloid layer. If desired, portions of the oxidant or reductant can be incorporated both in processing solutions and hydrophilic colloid layers, which can also contain a suitable source of catalyst such as light-sensitive silver halide.

The reducing agent and the oxidizing agent employed herein advantageously have good solubility in water; preferably, they are soluble in amounts of at least 0.1 g. and preferably at least 10 g./liter of water. However, other solvents, preferably a polar solvent such as methanol or ethanol, can be employed. In certain embodiments of the invention, reducing agents and oxidizing agents having very low water solubility can be employed.

The processes of the invention are admirably suited to amplify faint or even invisible quantities of catalyst. The invention is highly effective with light-sensitive silver halide materials wherein latent image silver or a low-density silver image can be utilized to generate an image record. In addition, the processes of the invention are useful in supplementing an image, for example, a silver or other zero valent metal image, or an image composed of other catalysts, oxidants or reductants utilized in accordance with the invention. It is also possible to replace preformed images with other images in accordance with the processes of the invention.

The improvements obtained in tanning processes in accordance with this invention can generally be obtained in any photographic element which contains a crosslinkable colloid or crosslinkable material. The photographic element can be a receiver element comprising a support having thereon at least one layer containing a crosslinkable material such as a binder vehicle; the receiver element can be placed in interfacial contact with another element during the tanning step to crosslink the material. The element can contain a support having thereon at least one layer containing a photographic recording material, such as silver halide, and at lest one layer containing a crosslinkable material. The imagewise tanning can be accomplished by means wherein at least one of the essential ingredients which are the oxidant, the reducing agent and the catalyst is provided during said process in an imagewise distribution, and the crosslinkable colloid is one which can be effectively crosslinked or hardened by the reaction products of the redox reaction.

In accordance with certain embodiments of this invention, an improvement is provided in photograhic processes wherein imagewise-exposed photographic elements comprising a support having coated thereon silver halide grains dispersed in a crosslinkable colloid are developed to produce a silver image, and the colloid is crosslinked imagewise in areas where a metallic silver develops. The improvement is obtained by contacting such photographic elements with the combination of an oxidant and reductant which undergo imagewise redox reaction in the presence of metallic silver, the reduced form of said oxidant being a crosslinking agent for the colloid. The process of this aspect of the invention can be conducted with a photographic developer as reducing agent. The oxidized form of the developing agent can also function as a crosslinking agent. The metallic silver produced by the action of a photographic developer on exposed silver halide catalyzes an oxidation-reduction reaction in accordance with the invention.

If desired, subsequent to developing a silver image in a cross-linkable colloid, the photographic element is contacted with the combination of oxidizing agent and reducing agent in accordance with the invention to generate the cross-linking agent. Using the latter procedure, it is not necessary that the reducing agent be a selective photograhic silver halide developing agent. When metal complexes are employed as oxidants, it is preferable that the ligands released on redox reaction should not interfere with the cross-linking.

This invention is useful in conventional tanning development where any suitable colloid, preferably gelatin, is cross-linked or hardened. Advantageously, the silver halide emulsion is an unhardened or partially hardened gelatin silver halide emulsion.

The practice of this aspect of the invention results in tanning with developers which have not been considered tanning developers, and increases the tanning obtained with conventional tanning developers. The invention is, accordingly, useful with any of the known tanning developing agents, e.g., pyrogallol and catechols such as 4-phenylpyrocatechol, or photographic developing agents which normally tan or cross-link colloids, such as the hydroquinones, pyrazolidones such as 1-phenyl-3-pyrazolidone, the p-phenylenediamines, the p-aminophenols and the diaminophenols. This embodiment of the invention is useful in dye imbibition and colloid transfer processes and in the preparation of photoresists, planographic printing plates and lithographic printing plates.

This invention permits the incorporation of substantial amounts of sulfite (e.g., sodium sulfite) in the tanning developer solutions, while retaining effective tanning. The amount of sulfite which could be added to conventional tanning developing agents was limited because of the inhibiting effect sulfite has on tanning development. Hence, using the practice of this invention, more stable tanning developer solutions are possible because of the higher tolerance for sulfite stabilizer in accordance with this invention.

The hardenable hydrophilic colloids useful in certain embodiments of this invention are those generally known in the photographic art which can be hardened by photographic hardeners such as formaldehyde. In certain preferred embodiments, the hardenable hydrophilic colloid is a material, such as gelatin, which has a melting point of less than 150° F. and preferably less than 120° F., and it preferbly has a melting point above about 80° F. In another embodiment, the hydrophilic colloid is a material which can be hardened by a photographic hardening agent to provide at least 100% lower water solubility of the hardened material at a temperature of 90° F.

The terms "unhardened hydrophilic colloid" and "cross-linkable colloid" as used herein refer to those materials which are capable of substantial further hardening. These materials may possess a small amount of crosslinking or may have been hardened or tanned slightly. However, these terms generally refer to those materials which are capable of being further hardened to provide a melting point differential between hardened and unhardened hydrophilic colloid of at least 20° F. and preferably at least 40° F. wherein the unhardened hydrophilic colloid has a melting point of less than 150° F.

Typical useful hydrophilic colloids include proteinaceous materials such as gelatin and similar materials which can be hardened by photographic hardeners, for example, such as other proteinaceous photographic vehicles.

The unhardened hydrophilic colloid is generally coated on the support at a coverage of from about 5 to about 3000 mg./ft.$^2$ and preferably from 10 to about 2000 mg./ft.$^2$.

Generally, it is preferred to use gelatin as the unhardened hydrophilic colloid but other vehicles, and especially those which contain groups which are ligands as described above, can also be used. Moreover, other photographic binding agents can be used as substituted in whole or in part for gelatin. Suitable photographic binders include colloidal albumin, cellulose derivatives, synthetic resins such as polyvinyl compounds and the like, and peferably the water-soluble and latex polyvinyl compounds. In certain instances, it is desirable to use latex polymers to improve dimensional stability such as, for example, the alkyl acrylates and alkyl methacrylate polymers. Where the binding agents are used as substitutes for all or part of the gelatin, the layer must still have the properties as defined for the unhardened hydrophilic colloid layer as set forth herein.

In certain embodiments, the photographic elements used in accordance with this invention have supports which have a hydrophobic surface. Elements of this type are desirable to provide a lithographic plate wherein the hardened gelatin will provide a hydrophilic surface and the areas where the colloid is removed will provide a hydrophobic or oleophilic surface. Typical useful hydrophobic supports include materials such as polyethylene, polystyrene, cellulose esters such as cellulose acetate, polyesters, polytetrafluoroethylene, polystyrenebutadiene, etc.

The hydrophobic surface can be treated to obtain adhesion to the unhardened hydrophilic colloid layer by methods known for improving the adhesion of hydrophilic materials to hydrophobic supports such as electron bombardment, flame-treating, oxidation with sulfuric acid-dichromatic solution, treatment with chlorine gas, hydrogen peroxide, nitric acid, etc.

The photographic elements of this invention may comprise incorporated developers such as black-and-white-developing agents or color-developing agents. Since the hardening of the hydrophilic colloid does not depend on a tanning developer such as 4-phenyl catechol, etc., generally any developing agent can be used to develop the silver halide. Likewise, where other photographic metal salts are used the reducing agent can be incorporated in the photographic element.

If the developing agent is incorporated in the silver halide emulsion or in a contiguous layer, development can be attained by using an alkaline activator.

Typical activator baths for the photographic element containing a developing agent include, for example, an aqueous solution of an alkaline material such as sodium carbonate, sodium hydroxide, potassium carbonate, potassium hydroxide, etc. Suitable baths can comprise, for example, an aqueous solution containing about 1% sodium hydroxide.

The developer solution or activator solution may also contain gelatin softeners such as citric acid or urea to aid in removal of the soft hydrophilic colloid during the wash-off step.

Typical of the activator solutions which can be used in my process are those disclosed in U.S. Pat. Nos. 2,596,754, 2,596,756, 2,725,298, 2,739,890, 2,763,553, 2,835,575, 2,852,371 and 2,865,745.

The development and/or tanning processes as referred to herein can be effected by bathing the photographic element in an activator solution or developing solution. Alternatively, a viscous processing solution can be placed between the photographic element and a spreading sheet for spreading in a predetermined amount across and in contact with the emulsion side of the photographic element so as to provide all of the solution required for processing. The viscous processing solution can be located in one or more pods or containers which can be readily ruptured when rocessing is desired.

The photographic elements used in the process of this invention which contain silver halide emulsions can be developed with black-and-white silver halide developing agents or color-developing agents such as aromatic primary amino compounds. The developing agents can be located in the photographic element or in the processing solution.

Useful black-and-white developing agents which can be used to develop the silver halide emulsion and can be incorporated in the photographic elements of this invention include those black-and-white developers disclosed in U.S. Pat. Nos. 2,315,966 by Knott issued Apr. 6, 1943, 2,592,368 by Yackel issued Apr. 8, 1952, 2,685,510 by Yackel issued Aug. 3, 1954, 2,716,059 by Yutzy et al issued Aug. 23, 1955, 2,751,300 by James et al issued June 19, 1956, 3,146,104 by Yackel et al issued Aug. 25, 1964, 3,180,731 by Roman et al issued Apr. 27, 1965, 3,276,871 by Abbott issued Oct. 4, 1966, 3,278,307 by Stewart et al issued Oct. 11, 1966, 3,287,129 by Rees et al issued Nov. 22, 1966, 3,291,609 by Porter et al issued Dec. 13, 1966, and 3,301,678 by Humphlett et al issued Jan. 31, 1967.

Typical useful black-and-white developing agents include 1-phenyl-3-pyrazolidone, 1-p-tolyl-3-pyrazolidone, 5-phenyl-3-pyrazolidone, 1-p-hydroxyphenyl-4,4-dimethyl-3-pyrazolidone, 1-phenyl-4-methyl-3-pyrazolidone, hydroquinone, catechol, pyrogallol, W-methyl-p-aminophenol, p-$\beta$-hydroxyethylaminophenol, p-$\alpha$-aminoethylaminophenol, N-methyl-N-($\beta$-sulfoamidoethyl)-p-aminophenol, ascorbic acid, p-hydroxyphenylglycine, morpholino hexose reductone 2,6-dimethyl morpholino hexose reductone, piperidino hexose reductone, piperidino hexose reductone monoacetate, 4-methyl piperidino hexose reductone, pyrrolidino hexose reductone and the like.

In certain aspects, the developing agent used in developing the photographic elements of this invention are aromatic primary amino color-developing agents such as p-aminophenols or p-phenylenediamines. Representative useful color-developing agents include those mentioned in Mees and James, *The Theory of the Photographic Process*, 1966, MacMillan Co., New York, pp. 278–311.

In those embodiments where color-developing agents are used, a color coupler can be used to produce an image dye to provide a visible image in the developed areas. Useful photographic color couplers include any compound which reacts (or couples) with the oxidation products of primary aromatic amino developing agent on photographic development to form an image dye.

I have also found that some compounds which are not ordinarily good silver halide developers can be used on combination with inert transition metal complexes, and especially cobalt complexes, to provide good silver halide developers or reducing agents in the context of this invention. Hydroquinone sulfonate, p-benzoquinone, sodium dithionite and the like can be used in combiation with trnsition metal complexes to provide metallic silver in layers of exposed silver halide emulsions and then serve as reactants in the redox reaction.

The photographic elements of this invention generally comprise a photographic light-sensitive metal salt. The metal salts are those which are capable of being imagewise-exposed to electromagnetic radiation, preferably in the ultraviolet or invisible region of the spectrum, to produce an image record which can then be contacted with a reducing agent or appropriately treated to produce an imagewise distribution of a metal which is preferably a Group Ib, VIa or VIII metal which is catalytically active for the tanning reaction and is most preferably a noble metal. The catalytically active metals are further described elsewhere in this specification, along with examples of specific useful catalysts. In certain highly preferred embodiments, the metal salt is a silver salt which is preferably a silver halide including silver chloride, silver bromide, mixed silver halides such as silver bromochloride, silver chlorobromoiodide and the like. Other silver salts such as silver oxalates, silver-dye complexes and the like can also be used. The silver halide emulsions can, of course, be negative silver halide emulsions, direct-positive silver halide emulsions or reversal silver halide emulsions. Thus, either negative- or positive-working systems can be made in accordance with this invention.

The photographic element can also contain a light-sensitive salt other than silver. Materials of this type include metal compounds which yield photolytically produced metal latent image sites (such as metal images of gold, copper, iron, tin, mercury, palladium, etc.), as well as those which merely form an electronic charge latent image such as various photoconductors known in the art. The former type of metal compounds includes various silver salts (e.g., halides, oxalates, etc.) as known in the art, as well as a variety of nonsilver metal salts, such as oxalate, citrate, etc., salts of a Group VIII, Group Ib or Group IIb metal, e.g., palladium oxalate, ferric ammonium oxalate, mercury oxalate, ferric ammonium citrate and the like. Nonsilver salts of this type and their uses are described in U.S. Pat. Nos. 2,750,292 issued June 12, 1956, and 3,597,206 issued Aug. 3, 1971, and British Pat. 1,265,844 dated Mar. 8, 1972. Various useful photoconductive compounds include metal oxides, such as titanium dioxide, antimony trioxide, zirconium dioxide, germanium dioxide, indium oxide, stannic oxide, barium titanate, lead oxide, tantalum oxide and tellurium oxide; metal sulfides such as cadmium sulfide, zinc sulfide and stannic sulfide; and metal selenides such as cadmium selenide. Inorganic photoconductors of this type are described further in U.S. Pat. 3,121,006 issued Feb. 11, 1964. Preferred photoconductive compounds for use in this invention are oxides and sulfides of Group IIb, IVb or IVa metals. Highly preferred are metal oxides, with titanium dioxide providing good results. Thus, preferred photosensitive metal compounds for use herein contain a Group Ib, IIb, IVb, IVa or VIII metal atom as seen in the Periodic Chart of the elements found on p. 30 of Cotton and Wilkinson, *Advanced Inorganic Chemistry*, 1962 Edition.

After exposure of the next above described elements, they are treated with a physical developer solution to deposit imagewise a catalytically active metal such as a Group VIII, VIa or Ib metal which typically is different from the metal of said photosensitive compound. Useful physical developer solutions contain as the major active ingredient an ionizable salt of a Group Ib, VIa or VIII metal. Physical developer solutions, for use with elements containing a photosensitive metal compound which upon exposure yields photolytically produced metal latent image sites, typically comprise a reducible heavy metal salt (e.g., a reducible salt of such metals as nickel, cobalt, iron, chromium or copper), a reducing agent for the heavy metal salt (e.g., formaldehyde, sodium hypophosphite, sodium hydrosulfide or potassium borohydride), and a complexing agent for heavy metal ions derived from the reducible heavy metal salt (e.g., carboxylic acid such as maleic acid, lactic acid, citric acid, aspartic acid or glycolic acid). Such physical developers are extremely stable under storage conditions, but in the presence of catalytic centers are reduced and deposit heavy metal on the catalytic sites. Physical developer compositions of this type, as well as the formulation thereof, are described, for example, in U.S. Pat. No. 3,597,206 which is incorporated herein by reference.

In those instances wherein the photosensitive metal compound used is a photoconductor as described previously, the deposition of a catalytically active Group Ib, VIa or VIII metal can be accomplished in a variety of ways. For example, a solution of a suitable metal salt can be applied to the exposed element whereby the trapped electron-hole pairs produced in the exposed areas of the photoconductor interact with the metal ions in solution to cause deposition of metal. Additionally, various electrolytic-deposition techniques can be used as described, for example, in U.S. Pat. No. 3,372,029 issued Mar. 5, 1968. The term "physical development" as used in connection with the present invention has reference to any suitable means for imagewise depositing a catalytically active Group Ib, VIa or VIII metal including the various means known in the art of photoconductography (e.g., see U.S. Pat. No. 3,010,883 issued Nov. 28, 1961).

The crosslinkable colloid is hardened or tanned in the areas where there is an imagewise distribution of metal without any apparent effect on the metal such as oxidation, etc. Therefore, the reaction can continue as long as desired, i.e., as long as there is sufficient cobalt-(III) ion complex in the element. Likewise, a photographic element containing an imagewise distribution of metal can be used to achieve hardening successively in several receiver sheets containing layers of unhardened hydrophilic colloid.

In certan embodiments, the photographic elements of this invention have a layer containing hardened hydrophilic colloid and a silver halide emulsion and at least one adjacent layer containing an unhardened crosslinkable colloid which can contain a pigment or opacifying agent. With elements of this type, it is possible to obtain a differentially hardened surface and, if desired, where the silver halide emulsion is in a layer next to the support and a transparent support is used, the element can be imagewise-exposed through the support. Additionally, since color developers can be used to develop the silver halide, a dye can be formed during the development step to provide materials in the element having opacity or at least a certain density in the visible region of the light spectrum.

In addition to preparing image records on conventional supports, my process can be used for making plates by means of stencils. An unhardened hydrophilic colloid layer is coated on a porous support such as cloth, silk or highly porous paper and, after being hardened by contacting with the photographic element as described elsewhere herein, the unhardened areas are removed by washing in warm water leaving the support pervious to a printing ink in the areas wherein the gelatin has been removed. Prints are then made from the resulting stencil in the usual manner, using a low-viscosity ink with a result that a large number of positive prints can be made.

The photographic elements can contain opacifying agents such as carbon black in the nonsilver halide-containing layer. Other pigments or dyes may also be used. When the term "pigment" is used herein and in the appended claims, it is to be understood to include, for example, any insoluble opacifying materials such that they impart density to the copy. However, the materials are preferably nonmetallic opacifying materials. While organometallic compounds or the like can be used, the term "nonmetallic opacifying agent" does not include the metals in their metallic or zero valent state and does not include activated carbon which apparently contains metal residues.

The photographic elements used in this invention comprise a hydrophilic colloid which can be either a hardened hydrophilic colloid or an unhardened hydrophilic colloid. Generally, where the photographic element comprises a silver halide emulsion dispersed in a hardened hydrophilic colloid, it can be used in combination with a receiver element having thereon an unhardened hydrophilic colloid layer, for example, as disclosed in Yackel, U.S. Pat. No. 3,364,024. A photographic element in accordance with this invention and a receiver element comprising an unhardened hydrophilic colloid layer can be put in interfacial contact in the presence of a highly alkaline liquid to achieve very good imagewise tanning in the receiver element. In certain preferred embodiments, the photographic element contains an unhardened hydrophilic colloid which is itself hardened imagewise by the reaction products of the redox reaction.

The processes and photographic elements described above provide many advantages. The photographic element can be developed in any developer which is stable and does not require a tanning developer which may be unstable to provide imagewise tanning of the hydrophilic colloid. The photographic element need contain only low coverages of silver, such as less than 50 mg./ft.$^2$, to obtain good hardening of high coverages of the hydrophilic colloid. Improved images can be made for lithographic printing since the tanning achieved by the use of cobalt (III) ion complexes appears to provide better tenacity of the hardened areas to a hydrophobic support. Moreover, the present processes provide a mechanism whereby several wash-off image records can be made from a single photographic element.

In certain embodiments, I have found that photographic elements containing a hydrophilic colloid at levels of 2000 mg./ft.$^2$ and above can be effectively tanned imagewise. This is quite unexpected since in many prior-art systems it was quite difficult to form a good imagewise distribution of a hardened hydrophilic colloid in a receiver element which contained thick layers of hydrophilic colloid and hardening was achieved solely by oxidized tanning developer.

The processing baths or solutions used herein generally contain only small amounts of or are substantially free of silver halide solvents such as sodium thiosulfate, thiocyanates, thioethers and the like. While bromide ions are often desirable in small amounts of about 2 to 40 g./l. of processing solution to repress development, high concentrations such as above 200 g./l. could function to bleach silver-containing layers and, likewise, defeat the primary amplification step. In certain embodiments, it is also desirable to maintain the ammonia in the amplifier at less than 10 g./l. since high ammonia concenrations can act as a silver halide solvent, thus allowing bleaching of the silver image.

The term "silver halide solvents" generally refers to compounds and concentration levels of those compounds which, when employed in an aqueous solution (60° C.), are capable of dissolving more than ten times the amount (by weight) of silver chloride than that which can be dissolved by water at 60° C.

The concentration of a solvent necessary to fix a siler halide layer is understood to mean that concentration of solvent in a liquid bath which will remove substantially all silver bromide from a photographic element containing a single silver bromide gelatin emulsion layer coated at 30 mg. silver per ft.$^2$ in 1½ minutes at 105° F. maintained at a pH range within 4.0–12.0.

As used herein, the phrase "change in light value" means instances wherein a colored reactive species undergoes a change in color or becomes colorless, as well as instances wherein a colorless reactive species becomes colored.

The invention can be further illustrated by the following examples.

EXAMPLE 1

Three film samples, A, B and C, are prepared by coating transparent support sheets with a single layer having 1222 mg./ft.$^2$ of an unhardened gelatin mixture which consists of 30% weight of bone gelatin and 70% weight of hide gelatin and containing, respectively, 475, 158 and 47.5 mg./ft.$^2$ of silver bromoiodide. Test strips of each film sample are exposed to light under a graduated-density test object through the support. Exposed test strips are developed at 21° C. (70° F.) in one of the following developer solutions:

| Developer Solution 1 | |
|---|---|
| 4-phenylpyrocatechol | 4.0 g. |
| sodium carbonate | 108.0 g. |
| water to make 1 liter; pH 11.0 | |
| Developer Solution 2 | |
| ascorbic acid | 1.0 g. |
| pyrogallol | 3.0 g. |
| p-methylaminophenol sulfate | 3.0 g. |
| 5-methylbenzotriazole | 0.05 g. |
| sodium bromide | 2.15 g. |
| sodium carbonate | 105.0 g. |
| water to make 1 liter; pH 11.0 | |
| Developer Solution 3 | |
| 4-amino-N-ethyl-N-(2-methoxyethyl)-m-toluidine di-p-toluene sulfonic acid | 10 g. |
| sodium sulfite | 2.0 g. |
| sodium carbonate | 25.0 g. |
| potassium bromide | 2.0 g. |
| water to make 1 liter; pH 10.5 | |
| Developer Solution 4 | |
| 2,4-diaminophenol | 7.3 g. |
| sodium sulfite | 5.0 g. |
| sodium carbonate | 20.0 g. |
| potassium bromide | 0.3 g. |
| water to make 1 liter; pH 10.0 | |
| Developer Solution 5 | |
| 2,4-diaminophenol | 3.65 g. |
| sodium sulfite | 1.0 g. |
| potassium bromide | 0.5 g. |
| water to make 1 liter; pH 6.4 adjusted with NaOH | |

Each test strip is treated at 21° C. (70° F.) for 1 min. in the following stop bath:

| | |
|---|---|
| boric acid | 35.0 g. |
| sodium sulfite | 35.0 g. |
| water to make 1 liter | |

Each test strip is then fixed at 21° C. (70° F.) for 2 min. The test strips are then washed for 3 min. at 49° C. (120° F.) to remove untanned emulsions. The strips are then immersed for 3 min. at 21° C. (70° F.) in a 1% weight aqueous buffered solution of the cyan dye 4,8-diaminoanthrarufin-2,6-disulfonic acid, which is imagewise-absorbed into the remaining gelatin layer in proportion to the degree of tanning. The test strips are then treated for 1 min. in a 1% aqueous acetic acid solution and dried.

Additional test strips are processed as above except that $[Co(NH_3)_6]Cl_3$ is added to the developer solution. The dye densities of the test strips are read through a Status A Red Filter as described in Example 1 and are recorded in the following table:

| Film | Ag/Ft.$^2$ | Dev. | [Co(NH$_3$)6]Cl$_3$ added (g./l.) | Dev. Time (min.) | Dye Density Dmin | Dmax |
|---|---|---|---|---|---|---|
| A | 475 | 1 | 0 | 4 | 0.06 | 1.72 |
| A | 475 | 1 | 5 | 4 | 0.06 | 1.98 |
| A | 475 | 3 | 0 | 7 | NT* | NT |
| A | 475 | 3 | 5 | 7 | 0.06 | 3.08 |
| B | 158 | 1 | 0 | 4 | 0.04 | 1.96 |
| B | 158 | 1 | 5 | 4 | 0.04 | 2.16 |
| C | 47.5 | 1 | 0 | 4 | 0.03 | 0.77 |
| C | 47.5 | 1 | 5 | 4 | 0.03 | 1.48 |
| C | 47.5 | 2 | 0 | 3 | 0.04 | 0.58 |
| C | 47.5 | 2 | 5 | 3 | 0.04 | 0.76 |
| A | 475 | 4 | 0 | 1 | NT | NT |
| A | 475 | 4 | 5 | 1 | 0.08 | 73.2 |
| A | 475 | 5 | 0 | 3 | NT | NT |
| A | 475 | 5 | 5 | 3 | 0.06 | 73.2 |

*NT signifies no tanning and all gelatin removed from the strip in the hot-water wash step.

When 5–10 g./l. of ethylenediaminetetraacetic acid are added to any of the developing solutions containing $[Co(NH_3)_6]Cl_3$, no improvement in tanning is observed over the developing solutions without $[Co(NH_3)_6]Cl_3$. Since ethylenediaminetetraacetic acid is an excellent complexing agent for cobalt(II) ions, this indicates that the cobalt(II) ion (reduced oxidizing agent according to the invention) is an essential part of the tanning mechanism.

Although the invention has been described in considerable detail with particular reference to certain preferred embodiments thereof, variations and modifications can be effected within the spirit and scope of the invention.

I claim:

1. In a process of imagewise-hardening at least one layer of a photographic element which contains a crosslinkable colloid, the improvement comprising reacting an inert transition metal ion complex oxidizing agent having a coordination number of 6 and which is capable of existing in at least two valence states with a reducing agent in the presence of a catalytic metal material or catalytic activated carbon material in a processing solution which is substantially free of silver halide solvents, wherein said catalytic material is provided in an imagewise distribution and wherein said oxidizing agent and said reducing agent are chosen so that the reaction products thereof are essentially noncatalytic for an oxidation-reduction reaction with said oxidizing agent and said reducing agent, and said oxidizing agent and said reducing agent are essentially inert to oxidation-reduction reaction in the absence of said catalytic material.

2. A process according to claim 1 wherein said oxidizing agent is a cobalt(III) ion complex.

3. A process according to claim 2 wherein said reducing agent is capable of reducing silver halide to metallic silver.

4. A process according to claim 1 wherein said oxidizing agent is a cobalt(III) complex, said reducing agent is capable of reducing exposed silver halide to metallic silver, and said catalytic material is a zero valent metal or chalcogen of a Group VIII or 1B element.

5. A process according to claim 4 wherein said catalytic material is metallic silver.

6. A process according to claim 1 wherein said oxidizing agent is a cobalt(III) ion complex containing at least three ammine ligands.

7. A process according to claim 6 wherein said inert transition metal complex is a cobalt(III) complex having a net charge of +3.

8. A process according to claim 1 wherein said crosslinkable colloid is capable of being crosslinked by the reaction products of said redox reaction to provide at least 100 percent lower water solubility of said colloid at 90° F.

9. A process according to claim 1 wherein said crosslinkable colloid is a hardenable hydrophilic colloid which has a melting point of less than 150° F. and is capable of being hardened to provide a melting point differential between hardened and unhardened hydrophilic colloid of at least 20° F.

10. A process according to claim 1 wherein said crosslinkable colloid is a gelatin.

11. In an image-forming process wherein a photographic element containing at least one layer of an imagewise-exposed silver halide emulsion is processed in a processing solution which is substantially free of silver halide solvents to provide an imagewise distribution of tanned crosslinkable colloid in a layer of crosslinkable colloid, the improvement comprising employing in said process in reactive association (a) an inert transition metal complex oxidizing agent having a coordination number of 6 and which is capable of existing in at least two valence states and (b) a reducing agent which is capable of reducing exposed silver halide to metallic silver, wherein said oxidizing agent and said reducing agent undergo redox reaction in the presence of metallic silver and are essentially inert to oxidation-reduction reaction in the absence of said metallic silver, said oxidizing agent and said reducing agent being chosen so that the reaction products thereof are essentially noncatalytic for an oxidation-reduction reaction with said oxidizing agent and said reducing agent.

12. A process according to claim 11 wherein said inert transition metal complex is a cobalt(III) complex which has a net positive charge of +3. and contains at least three ammine ligands.

13. A process according to claim 11 wherein said reducing agent is a primary aromatic amino compound and a color coupler is present during said process, whereby a dye can be formed by reaction of the oxidized primary aromatic amine with said color coupler.

14. A process according to claim 11 wherein said inert transition metal complex is a cobalt complex having a coordination number of 6 and comprises a ligand selected from the group consisting of ethylenediamine, propylenediamine, diethylenetriamine, triethylenetetramine, amine, nitrate, nitrite, azide, chloride, thiocyanate, isothiocyanate, water and carbonate, said complex comprising (a) at least 2 ethylenediamine ligands or (b) at least 5 amine ligands or (c) at least 1 triethylenetetramine ligand or (d) at least 2 propylenediamine ligands.

15. A process according to claim 11 wherein said oxidizing agent is a cobalt(III) ion complex present in the processing composition in a concentration of at least 10 g./l. based on cobalt.

16. A process according to claim 11 wherein said crosslinkable colloid is a hardenable hydrophilic colloid.

17. A process according to claim 11 wherein said crosslinkable colloid is present at a coverage of from about 10 to about 2000 mg./ft.$^2$.

18. A process according to claim 11 wherein the unhardened crosslinkable colloid is removed by washing after said tanning process.

19. A process according to claim 11 wherein said reducing agent is a tanning silver halide developer.

20. A process according to claim 11 wherein said photographic element contains less than 50 mg. of silver halide per ft.$^2$ based on silver.

21. A process according to claim 11 wherein said reducing agent is a primary aromatic amino silver halide developing agent.

22. A process according to claim 11 wherein a color coupler is present in said process and said reducing agent is a color silver halide developing agent.

23. A process according to claim 11 wherein said crosslinkable colloid is a hardenable gelatin which is present at a coverage of from about 10 to about 2000 mg./ft.$^2$ and said oxidizing agent is cobalt(III) hexammine chloride.

24. In a photographic process wherein an imagewise-exposed photographic element comprising a support having coated thereon silver halide grains dispersed in a crosslinkable colloid is developed to produce a metallic silver image and said colloid is crosslinked imagewise in the areas where metallic silver develops, the improvement which comprises conducting said photographic development with the combination of (a) a photographic developer and (b) an inert transition metal ion complex having a coordination number of 6 and which is capable of existing in at least two valence states, which is reduced by said photographic developer in the presence of metallic silver, the reduced form of said transition metal ion complex being a crosslinking agent for said colloid, wherein said photographic developer and said inert transition metal ion complex are essentially inert to oxidation-reduction reaction in the absence of said metallic silver.

25. A photographic process as described in claim 24 wherein said crosslinkable colloid is unhardened gelatin, the photographic developer is a photographic tanning developing agent, and the oxidant is a cobalt complex having a coordination number of 6.

26. A photographic process as defined in claim 25 wherein said tanning developing agent is 4-phenylpyrocatechol and said cobalt complex is cobalt hexammine(III) chloride.

27. A photographic process as defined in claim 26 wherein said photographic element is treated with said combination of oxidant and reductant subsequent to the development of metallic silver.

28. A photographic process as defined in claim 27 wherein said hydrophilic colloid comprises at least partially unhardened gelatin, said reductant is 4-phenylpyrocatechol, and said oxidant is cobalt hexammine(III) chloride.

* * * * *